United States Patent [19]
Kaneko et al.

[11] Patent Number: 5,798,992
[45] Date of Patent: Aug. 25, 1998

[54] LASER DIODE MONITORING APPARATUS FOR DETERMINING THE DECAY OF LASER DIODE

[75] Inventors: Shinji Kaneko; Seiji Ohura; Yoshizo Mihara; Yukio Sato, all of Tokyo, Japan

[73] Assignee: Sony Corporation, Tokyo, Japan

[21] Appl. No.: 727,047

[22] Filed: Oct. 8, 1996

[30] Foreign Application Priority Data

Oct. 11, 1995 [JP] Japan .................. 7-262947

[51] Int. Cl.$^6$ .................................................. G11B 7/00
[52] U.S. Cl. ...................... 369/116; 369/54; 372/38
[58] Field of Search .................. 369/116, 50, 54, 369/120, 121, 13, 106; 372/31, 33, 36, 28, 29; 250/205

[56] References Cited

U.S. PATENT DOCUMENTS

| | | | |
|---|---|---|---|
| 4,796,250 | 1/1989 | Kobayashi et al. | 369/116 |
| 4,855,988 | 8/1989 | Shinbayashi et al. | 369/116 |
| 5,040,163 | 8/1991 | Sasaki et al. | 369/106 |
| 5,477,557 | 12/1995 | Inaba et al. | 369/116 |
| 5,602,814 | 2/1997 | Jaquette et al. | 369/116 |

*Primary Examiner*—Thang V. Tran
*Attorney, Agent, or Firm*—Jay H. Maioli

[57] ABSTRACT

A laser diode monitoring apparatus activates the laser diode in a manner of impulse, measures the sag of light output level, and judges the light emitting performance to be deteriorated if the sag is greater than the reference value. The value of sag comprehends the inequality of light output characteristics of individual laser diodes and the variation of ambient temperature, enabling the accurate decay determination.

18 Claims, 7 Drawing Sheets

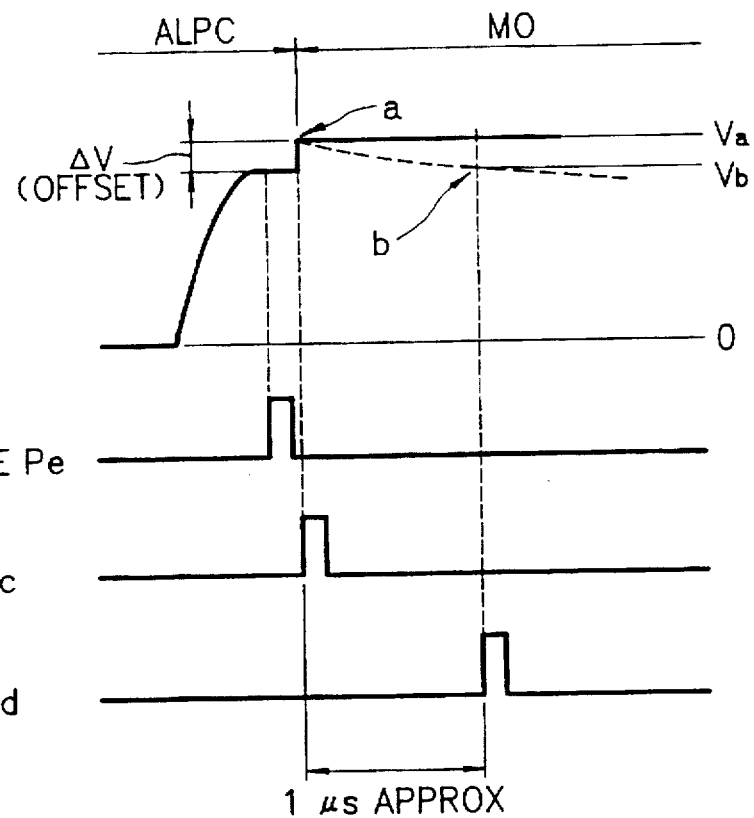
FIG. 4A LASER POWER
FIG. 4B ERROR HOLDING PULSE Pe
FIG. 4C SAMPLING PULSE Pc
FIG. 4D SAMPLING PULSE Pd
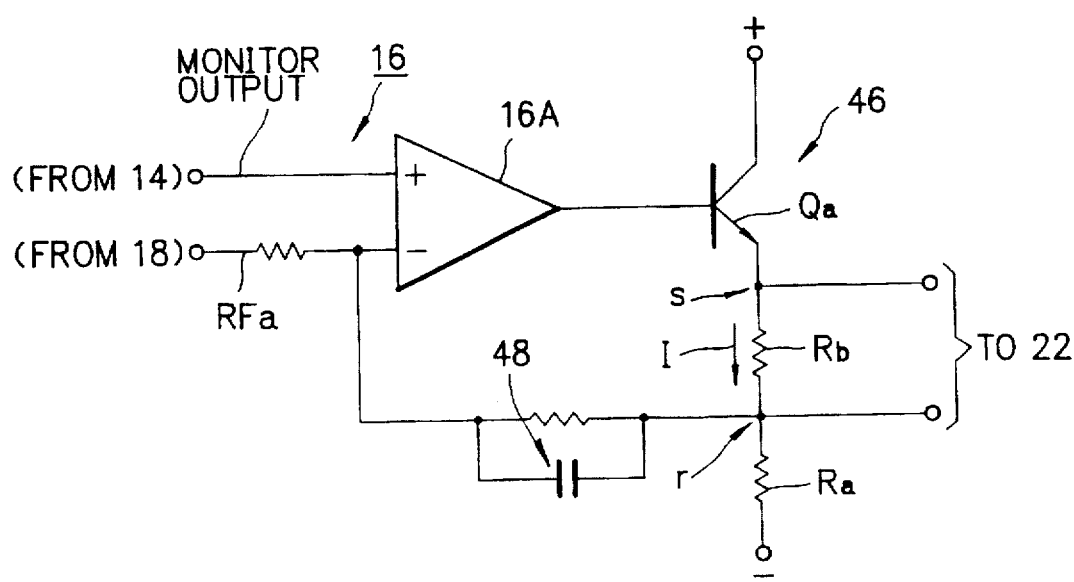
FIG. 5

FIG. 9A
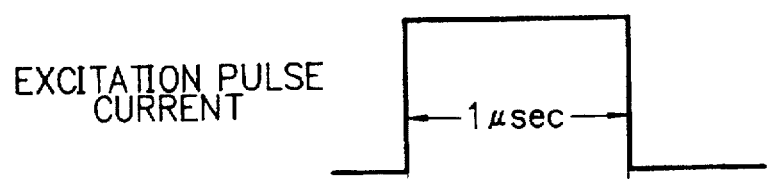
EXCITATION PULSE CURRENT
FIG. 9B
LIGHT POWER
FIG. 9C
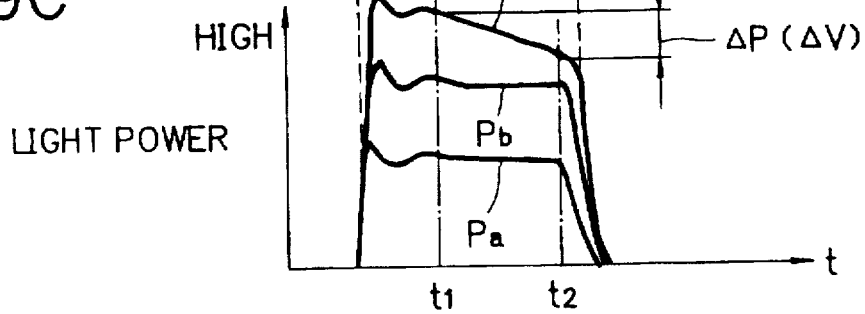
LIGHT POWER

1

LASER DIODE MONITORING APPARATUS FOR DETERMINING THE DECAY OF LASER DIODE

BACKGROUND OF THE INVENTION

1. Field of the Invention

The present invention relates to a laser diode monitoring apparatus for determining the decay of laser diode, the apparatus being applicable suitably to a data recording and reproducing apparatus using amagneto-optical recording disk. Specifically, the apparatus is designed to be capable of a determining the decay of laser diode accurately even during the operation based on the monitoring of the light output level of the laser diode at a specific portion of sectors of tracks of the disk.

2. Description of the Related Art

A magneto-optical recording disk has its recording surface partitioned into an inner recording region for channel 1 and an outer recording region for channel 2, with these regions including tracks each divided into multiple sectors, e.g.,42 sectors, as shown in FIG. 6A. One sector consists of a preceded address area (ADD) and a data recording area (MO), as shown in FIG. 6B.

The address area ADD begins with a sector mark (SM), which is followed by three repetitive address data of the same content, and ends with postamble data (PA). The three repetitive records of address data ADD1, ADD2, and ADD3 are intended for the reliable readout of address data in consideration of possible read error. The address data consists of VFO data, address marker (AM), and identification data (ID). The VFO (variable frequency oscillator) generates a reference clock signal of a fixed reference frequency used for the pulling of the clock generating PLL oscillator.

The address data is preformatted in the form of pits on the disk surface. The address area ADD is followed by the data recording area MO, which begins with a test area. The test area has a record of ALPC (automatic laser power control) data used for the control of the power level of laser diode and VFO data VFO4 which has the same content as the VFO data VFO1–VFO3 of the address data area.

The data recording area MO ends with a buffer area (blank area) which serves as the border to the address area ADD of the successive sector. It should be noted that the number of sectors of track and the number of bytes of a sector shown in FIGS. 6A and 6B are merely examples.

Data is recorded on the magneto-optical disk 1 or data and address data recorded on the magneto-optical disk 1 are reproduced based on the projection of a laser beam onto the disk surface. A laser diode is used generally for the emission of the laser beam. The laser diode has its light emitting performance deteriorated with the time length of use, and FIG. 7 is a graph showing the characteristic of a typical laser diode. The laser diode is replaced when the excitation current for producing the prescribed light level following the screening period has increased to 1.2 to 1.3 time the normal value as shown in FIG. 7.

This nature suggests the feasibility of the detection of the decay of the laser diode through the monitoring of the excitation current. However, the laser diode has a temperature-dependent characteristic as shown in FIG. 8. Specifically, it requires a larger excitation current for producing the prescribed light level as the temperature rises. On this account, if the ambient temperature varies, the decay of the laser diode cannot be assessed accurately by simply monitoring the excitation current. Another disturbing factor to be taken into consideration is the inequality of the light emitting performance of individual laser diodes.

Since the decay of a laser diode cannot be detected accurately during its use by simply monitoring the excitation current as mentioned above, it is conventionally replaced on expiration of a certain run time which is derived from the guarantee period of the appliance manufacturer. The laser diode dedicated to only the reproducing operation has a guarantee period of 10,000 hours or more, and it does not need to be subjected to the determination of decay.

Whereas, the laser diode which operates at a high laser power for the recording and for the erasing operations has a relatively short guarantee period of 500 to 5,000 hours, and the user is required to replace it on expiration of a certain run time derived from the guarantee period in order to avoid the faulty recording due to a deficient light output. Because of the infeasibility of accurate assessment of the decay of the laser diode as mentioned above, it is probable that it may be replaced prematurely and wastefully.

When an excitation pulse current of around 1-μs width as shown in FIG. 9A is fed to a new laser diode, it produces a light output having a generally rectangular waveform as shown by the solid line in FIG. 9B. As the laser diode decays and demands more input power, it produce a sagging light output waveform as shown by the dashed line in FIG. 9B.

FIG. 9C compares the waveforms of small, medium and large light powers resulting from a decaying laser diode. Waveform Pa is of a small light power (1 to 2 mW measured on the magneto-optical disk surface) and waveform Pb is of a medium light power (around 5 mW), and even the decaying laser diode does not virtually vary the light output performance in these cases. Waveform Pc exhibits a degraded characteristic, known as "droop" characteristic, resulting from a larger light power (7 to 9 mW).

OBJECT AND SUMMARY OF THE INVENTION

Accordingly, an object of this invention is to provide a laser diode monitoring apparatus capable of determining the decay of the laser diode accurately by monitoring the light output level for detecting the droop characteristic.

According to a first aspect of the present invention, there is provided a laser diode monitoring apparatus which operates to judge the decay of the laser diode based on the variation of light output level resulting from the activation by an excitation pulse current.

According to a second aspect of the present invention, there is provided a laser diode monitoring apparatus comprising a laser diode, a photodiode which receives the light output of the laser diode, a selector which receives the results of comparison of the laser diode light output with reference values set for individual operation modes and selects a comparison result depending on the operation mode, a laser diode driver which receives the output of the selector, means for determining the decay of laser diode, and a controller which receives the result of determination.

According to a third aspect of the present invention, there is provided a laser diode monitoring apparatus for determining the decay of a laser diode which is used with a magneto-optical recording disk, based on the light output level of the laser diode measured immediately after the ALPC period.

According to a fourth aspect of the present invention, there is provided a laser diode monitoring apparatus comprising, a laser diode, a photodiode which receives the light output of the laser diode, a selector which receives the results of comparison of the laser diode light output with reference values that are set for individual operation modes and selects the comparison result depending on the operation mode, a laser diode driver which receives the output of the selector, an error holding amplifier which holds the error level of the ALPC period, a level shift circuit located at the front of the error holding amplifier, means for determining the decay of laser diode, and a controller which receives the result of determination, with the laser diode being excited immediately after the APC period at the error level that is rendered the level shifting so that the decay of laser diode is judged based on the resulting light output characteristic.

In the invention described above, the laser diode is driven at a high power (recording or erasing mode), and the light output level of the laser diode resulting from the application of an excitation pulse current is monitored. The light output maintains a virtually constant level throughout the period from rising to falling unless the light emitting performance of the laser diode is deteriorated.

However, as the laser diode decays, the light output sags, exhibiting the droop characteristic. Since the droop characteristic comprehends the inequality of characteristics of individual laser diodes and the variation of ambient temperature, the difference of light output levels at time points near the rising and falling edges is measured. The decay of laser diode which jeopardizes the recording and erasing operations is predicated if the differential light output level exceeds the prescribed value, and it can be indicated to the operator so as to replace the laser diode.

The droop characteristic can be detected instead of using the excitation pulse current, but based on the monitoring of the light output levels across the same time span as of the case of excitation pulse current immediately after the ALPC period, with the erasing mode being set. In any case, the decay of laser diode can be judged accurately based on the differential light output level without being affected by the variation of ambient temperature and the inequality of light output characteristics of individual laser diodes.

BRIEF DESCRIPTION OF THE DRAWINGS

FIG. 4 is a diagram explaining the operation of the circuit shown in FIG. 3;

FIG. 5 is a schematic diagram showing a specific arrangement of the level shift circuit;

FIG. 9 is a set of waveform diagrams showing the droop characteristic of light power indicative of the decay of laser diode.

DESCRIPTION OF THE PREFERRED EMBODIMENTS

The laser diode monitoring apparatus of this invention embodied in the application to the magneto-optical recording and reproducing apparatus will be explained in detail with reference to the drawings.

The laser power in the data recording and erasing operations is controlled automatically to follow the reference level by utilization of the ALPC period mentioned previously. The laser diode monitoring apparatus is included within the APC loop.

Figure 1:
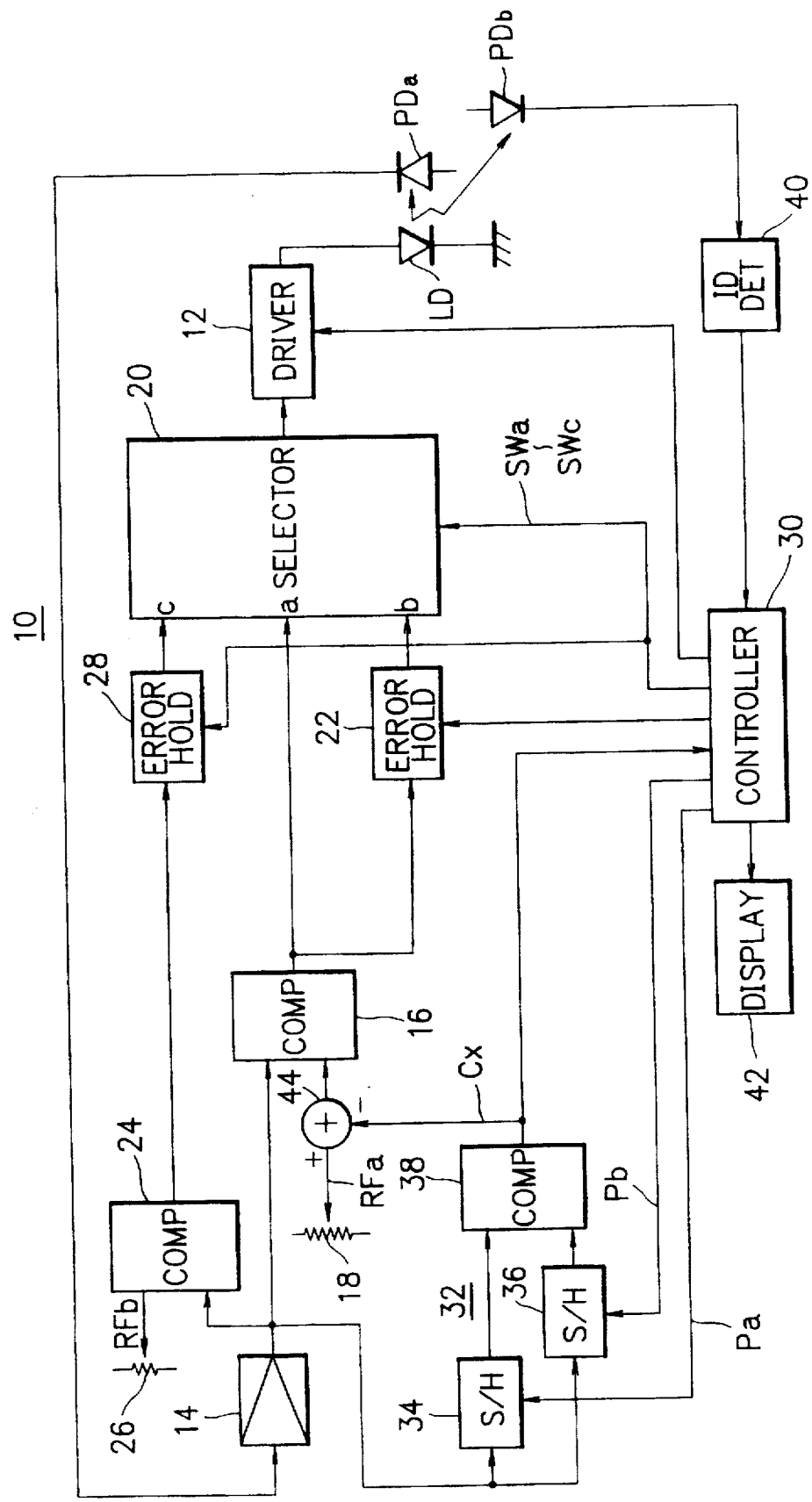
FIG. 1 is a block diagram showing the principal portions of the laser diode monitoring apparatus based on an embodiment of this invention.

In the laser diode monitoring apparatus shown in FIG. 1, a laser diode LD is energized by the output current of a driver 12, and the light output is detected by photodiodes PDa and PDb which function as opto-electric transducers. The photodiode PDa has its output amplified by an amplifier 14 and then received by a comparator 16, by which it is compared with a reference voltage RFa provided by a reference voltage source 18. The comparator output controls the driver 12 such that the output from the amplifier 14 is equal to the reference voltage RFa.

An error holding amplifier 22 is used to keep the comparator output, which has been controlled to follow the reference laser power in the ALPC period, for the subsequent period of a data recording area. The comparator output in the ALPC period (level P of waveform B of FIG. 2) is held in response to a sampling pulse (not shown) which is produced in the latter half section of the ALPC period, and the laser diode LD is controlled to produce the reference laser power.

Figure 2:
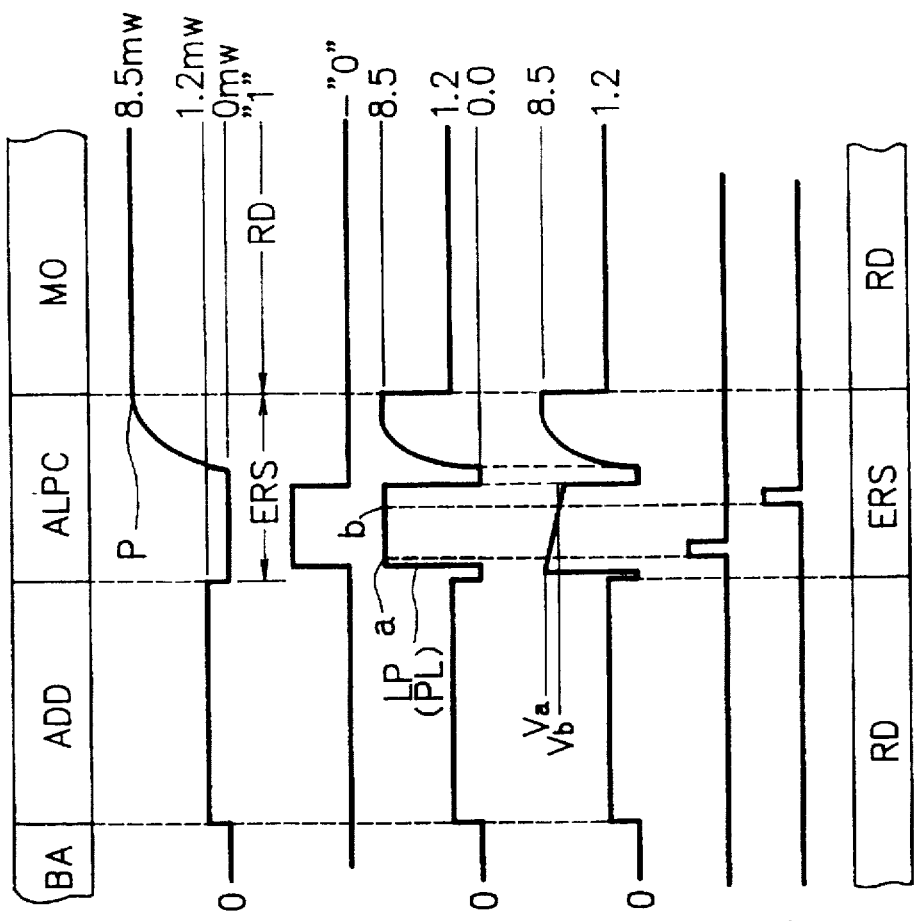
FIG. 2 is a diagram explaining the operation of the circuit shown in FIG. 1.

The magneto-optical disk 1 has a recording format which includes an address field ADD, a data recording field MO, and an ALPC field which precedes the data recording field MO, as shown by A in FIG. 2. Different values of laser power (the light power measured on the magneto-optical disk) are used for these fields. The laser power also differs depending on the operation mode. Specifically, the laser power used for retrieving the address data and the data recorded on the magneto-optical disk 1 is as low as around 1.2 mW, whereas the laser power used for recording or erasing data is 8 to 9 mW.

In the reproducing mode, a comparator 24 is used to compare the light output with the reference voltage RFb provided by a reference voltage source 26, and the comparator output is held by an error holding amplifier 28. The driver 12 is activated in accordance with the held value.

The error holding amplifiers 22 and 28 and selector 20 which hold the comparator outputs and selects a comparator output depending on the operation mode are supplied with sampling pulses and a switching pulse SW that depends on the operation mode from a controller 30.

In addition to the foregoing arrangement, there is included a decay determining means 32 for the laser diode LD, which consists of a pair of sample-holding circuits 34 and 36 which receive the output of the amplifier 14 and a comparator 38 which receives the outputs of these sample-holding circuits. With the APC loop being open, determination of laser diode decay takes place, and the comparator output Cx is delivered to the controller 30 and also to an adder 44, by which it is added to the reference voltage RFa.

The photodiode PDb has its detection output received by an ID detector 40, by which ID data recorded in the address area ADD is detected and delivered to the controller 30. Only after the detection of this ID data, it becomes possible to control the emission of the laser diode LD in the ALPC period. If the controller 30 detects ID data, the controller 30 provides a pulse signal which has a predetermined width for the ALPC period to the driver 12.

The controller 30 has an associated display 42, by which the determination of decay of the laser diode LD is indicated to the operator. An alarm means (not shown) may be added to the display 42 so that the operator is prompted acoustically to replace the laser diode LD. Alternatively, a voice synthesizer may be provided in place of the alarm means so that the operator is prompted by a voiced message to replace the laser diode LD.

The laser diode monitoring apparatus 10 arranged as described above operates in the normal reproducing mode to drive the laser diode LD in accordance with the output of the error holding amplifier 28 received on terminal c of the selector 20. At this time, the light output is 1.2 mW in terms of the laser power detected by the photodiode PDa.

In the erasing mode, the selector 20 is controlled to select the input terminal c so as to set the reproducing mode only for the address area ADD. After that, selection is switched to the a-terminal so as to set the APC mode for the ALPC period, and it is switched to the b-terminal at the end P of the ALPC period so that the laser diode LD is driven thereafter in accordance with the output of another error holding amplifier 22 (refer to waveform B of FIG. 2) based on the closed-loop control so that the light output is 8.5 mW in terms of the laser power detected by the photodiode PDa.

Detection of the decay of laser diode is implemented by utilization of the ALPC period. Since the laser diode LD needs to be driven at a high laser power for the detection of decay as mentioned previously in connection with FIG. 9, the selector 20 is controlled to set the erasing mode (or recording mode) during the ALPC period. The operation mode for periods other than the ALPC period is arbitrary, and it is set to the reproducing mode in this embodiment (refer to waveform H of FIG. 2).

At decay determination, a certain period that precedes the beginning of ALPC is used to apply a test pulse current having a width of about 1 μs. For this implementation, the write data to be fed to the driver 12 is made high for a prescribed duration (1 μs) at the beginning of ALPC, and it is made low invariably for the entire period of the data recording area MO, as shown by waveform C in FIG. 2. Consequently, a light power PL derived from the test pulse current LP is produced as shown by waveform D in FIG. 2. The laser diode LD is rendered the APC control immediately after the test pulse current LP as shown by waveform D, and thereafter the low laser power drive mode is restored for data retrieval.

There arises virtually no difference in level at the beginning and end of the light power PL for the test pulse current LP unless the light emitting performance of the laser diode LD is deteriorated, as explained previously in connection with FIG. 9. If, on the other hand, the light emitting performance becomes to deteriorate, the sag of laser power emerges progressively as shown for its ultimate state by waveform E in FIG. 2.

A first sampling pulse Pa (shown by waveform F in FIG. 2) is supplied to the first sample-holding circuit 34 of FIG. 1 at a time point close to the rising edge of the light power PL, and the level Va at time point "a" is sampled and held. Similarly, a second sampling pulse Pb (shown by waveform G in FIG. 2) is supplied to the second sample-holding circuit 36 of FIG. 1 at a time point close to the falling edge of the light power PL, and the level Vb at time point "b" is sampled and held.

The outputs of these sample-holding circuits are delivered to the comparator 38, and their differential value $\Delta V$ (Va−Vb) is compared with the reference value Vf. If the differential value $\Delta V$ exceeds the reference value Vf, indicative of the advanced decay of the laser diode LD, it is delivered to the controller 30, which then activates the display 42 thereby to prompt the operator to replace the laser diode LD.

The droop characteristic caused by the deteriorated light emitting performance of the laser diode comprehends the inequality of characteristics of individual laser diodes and the variation of ambient temperature. Accordingly, by monitoring the droop characteristic, it is possible to detect accurately the decay of laser diode which could possibly impair the operation in the recording mode and the erasing mode in a state of comprehension of the inequality of characteristics of individual laser diodes and the variation of ambient temperature.

In addition to the arrangement for the foregoing operation, the comparison output $\Delta V$ is further supplied to the adder 44 as shown in FIG. 1 so that the reference value is shifted, i.e., lowered to RFa-$\Delta V$, following the determination of laser diode decay by the reason explained in the following.

Generally, the laser diode LD has its erasing laser power set higher by about 25% in order to cope with negative factors including the contamination of optical system and the fluctuation of the reflectivity of disk surface. For this marginal setting, the AV is set to a value that is equal to 15% of the above-mentioned setup laser power.

In consequence, the data erasing operation based on the laser power of 15% reduction at the determination of decay can meet the erasing condition, and it becomes possible for the operator to replace the laser diode on completion of data recording instead of suspending the recording operation. For this implementation, the comparison output Cx for the differential value $\Delta V$ is supplied to the adder 44.

The arrangement shown in FIG. 1 is capable of determining the decay of laser diode LD even during the use of the magneto-optical recording disk. Since the droop characteristic of laser diode does not vary with the ambient temperature, determination of decay is accurate irrespective of the ambient temperature variation. The operator is allowed to use the apparatus continuously even after the detection of laser diode decay and to replace it at a proper occasion.

Figure 3:
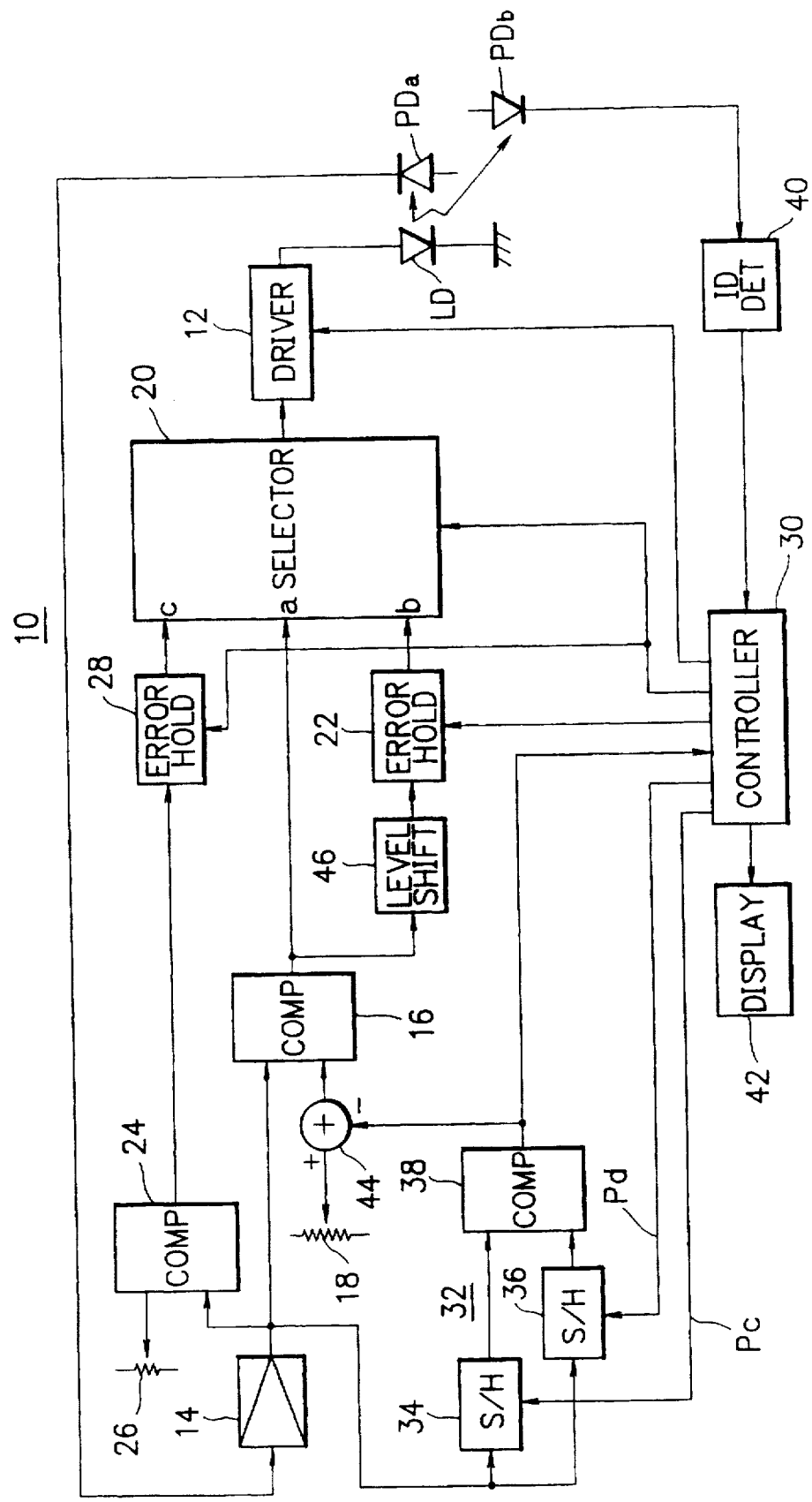
FIG. 3 is a block diagram showing the principal portions of the laser diode monitoring apparatus based on another embodiment of this invention.
Figure 6A:
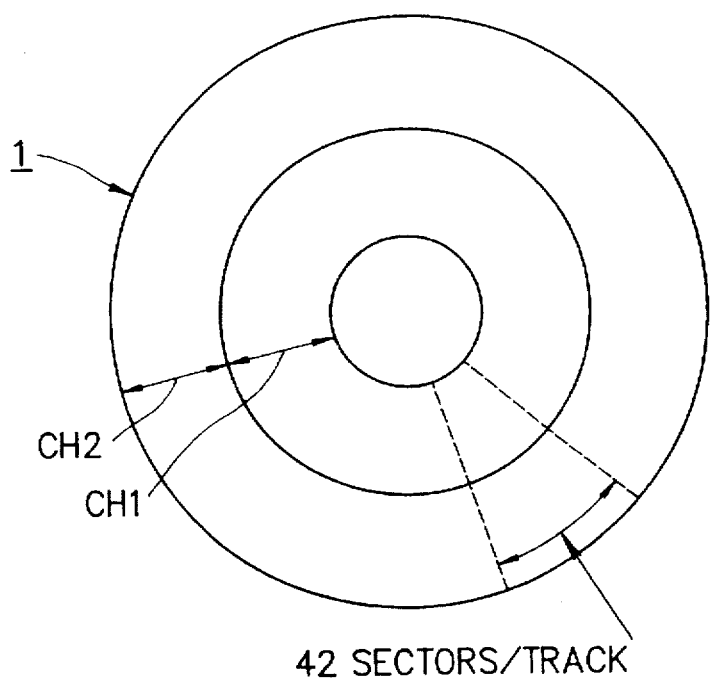
FIGS. 6A and 6B are diagrams explaining an example of the recording format of the magneto-optical recording disk.
Figure 6B:
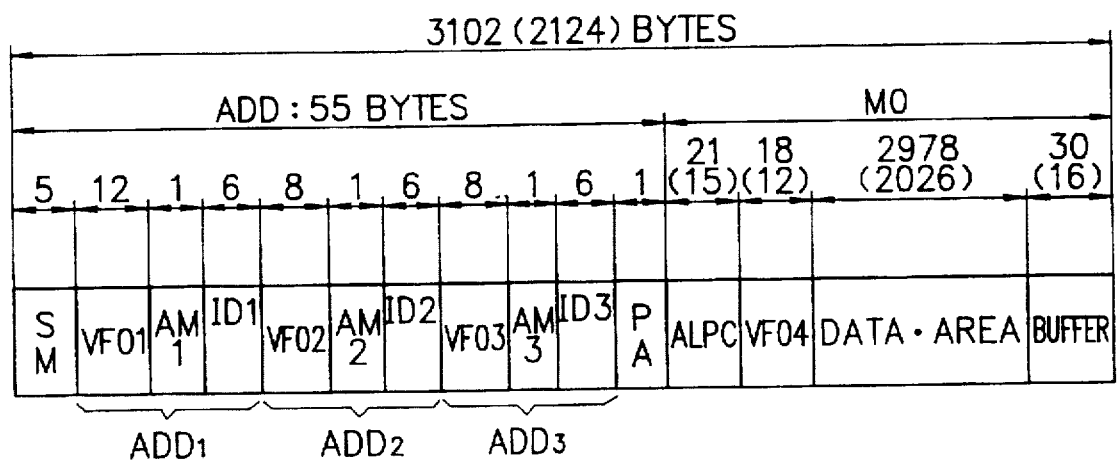
Figure 7:
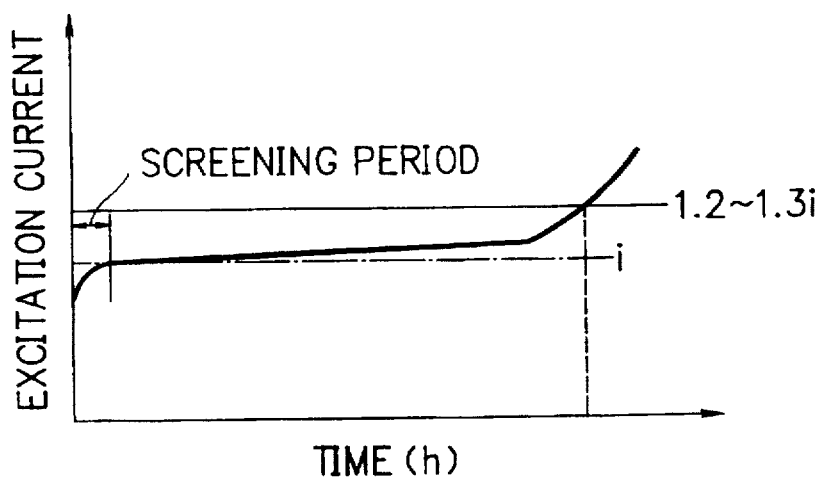
FIG. 7 is a graph showing the variation of laser diode excitation current with the run time of laser diode.
Figure 8:
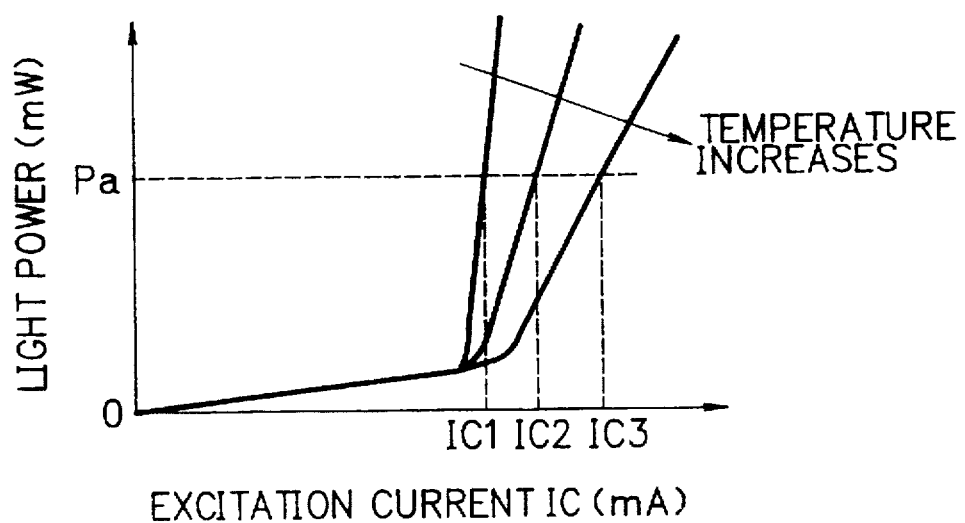
FIG. 8 is a graph showing the dependency of the light output on the variation of ambient temperature.

FIG. 3 shows another embodiment of this invention. This circuit arrangement is intended to judge the decay of laser diode without using an excitation pulse current, and it is specifically designed to judge the decay of laser diode by detecting the variation of light output immediately after the ALPC period.

The circuit arrangement differs from that of FIG. 1 in the provision of a level shift circuit 46 at the front of the error holding amplifier 22. The level shift circuit 46 is activated in the erasing mode to shift (raise in this embodiment) the ALPC level by $\Delta V$ immediately after the ALPC period, as shown by waveform A in FIG. 4. The offset value $\Delta V$ is equivalent to 1.0 mW.

The light output characteristic in the normal state is shown by the solid line on waveform A, the light emitting performance of the laser diode is deteriorated due to the droop characteristic as shown by the dashed line.

The first sample-holding circuit 34 is supplied with the first sampling pulse Pc shown by waveform C in FIG. 4, and it holds the laser power level Va at time point "a". On expiration of about 1μs, the second sample-holding circuit 36 receives the second sampling pulse Pd shown by waveform D and holds the laser power level Vb at time point "b". The differential value $\Delta V$ of these levels is evaluated.

The differential value $\Delta V$ is compared with the reference value Vf, and if $\Delta V$ exceeds Vf, the comparison output Cx indicative of the detection of laser diode decay is delivered so that an alarming operation similar to that explained in connection with FIG. 1 takes place. As a result, determination of the decay of laser diode can be accomplished without using a test pulse current. This decay determination operation can be carried out also in the data erasing mode.

FIG. 5 shows a specific circuit arrangement of the above-mentioned portion of FIG. 3, in which a differential amplifier 16A that constitutes the comparator 16 is supplied on its non-inverting input terminal with the monitor output provided by the amplifier 14 and the reference voltage RFa on its inverting input terminal. The comparison output is delivered to the level shift circuit 46 which also serves as a buffer amplifier.

The level shift circuit 46 includes a transistor Qa, which is connected on the emitter path with an emitter resistor Ra. The emitter output produced on the node "r" is fed back through an RC feedback circuit 48 to the inverting input terminal of the differential amplifier 16A and also delivered to the selector 20 as the comparison output of the APC mode.

Another resistor Rb for level shifting is connected in series to the emitter resistor Ra, and it provides the comparison output of the APC mode for the selector 20. The node "s" between the emitter of Qa and the resistor Rb has a voltage level higher than that of the node "r" by the amount of I×R (where I is the emitter current and R is the resistance of Rb), resulting in an increased drive current in the APC mode. The resistance values of these resistors are selected properly such that the voltage difference I×R results in an increase of laser power by 1.0 mW.

According to this invention, as described above, it becomes possible to judge the deterioration of the light emitting performance of laser diode accurately even during its operation by monitoring the light output level of the laser diode at the specific portion of record. The inventive circuit is capable of determining the decay of laser diode accurately during the use irrespective of the inequality of light output characteristics of individual laser diodes and the variation of ambient temperature, and such improprieties as the abortion of data recording in the recording mode can be prevented.

With a sufficient marginal operating condition being set for the driving of laser diode, the inventive circuit enables the continuous use of the laser diode even after the detection of decay, allowing the operator to prepare the replacement of the laser diode.

What is claimed is:

1. A laser diode decay determination device for determining whether to replace a laser diode based upon a deterioration of light emitting performance of said laser diode, said device comprising:
    means for driving said laser diode to produce a light output in accordance with a pulse signal;
    means for detecting a level of the light output of said laser diode upon driving by said driving means; and
    decay determination means for determining the deterioration of the light emitting performance of said laser diode based on detection by said means for detecting of a variation of the light output level and including
        first means for detecting, as a first light output level at a first time point, the light output produced by said laser diode in accordance with the pulse signal,
        second means for detecting the light output as a second light output level at a second time point which is later than the first time pont, and
        means for determining the light emitting performance of said laser diode to be deteriorated and determining to replace said laser diode upon detecting that a difference between the first light output level and the second light output level is greater than a predetermined value.

2. The laser diode decay determination device according to claim 1, wherein said decay determining means comprises:
    first means for detecting, as a first light output level at a first time point, the light output produced by said laser diode in accordance with the pulse signal;
    second means for detecting the light output as a second light output level at a second time point which is later than the first time pont; and
    means for determining the light emitting performance of said laser diode to be deteriorated upon detecting that a difference between the first light output level and the second light output level is greater than a predetermined value.

3. The laser diode decay determination device according to claim 1, wherein said laser diode is used for recording and reproducing information signals on a magneto-optical recording disk.

4. The laser diode decay determination device according to claim 1 further including automatic laser power control (ALPC) means for controlling the light output of said laser diode to be constant, said pulse signal being produced within a period in which said ALPC means is operative.

5. The laser diode decay determination device according to claim 4, wherein said pulse signal activates said laser diode to produce a light output relevant to at least one of a recording mode and an erasing mode.

6. A laser diode decay determination device for determining whether to replace a laser diode based upon a deterioration of light emitting performance of said laser diode used to perform at least one of record, reproduce and erase information signals on a magneto-optical recording disk having an automatic laser power control (ALPC) area for controlling a light output of the laser diode to follow a predetermined value, said device comprising:
    driving means for driving said laser diode during a time period corresponding to the ALPC area of said magneto-optical recording disk in accordance with a pulse signal;
    light reception means for receiving the light output of said laser diode produced in accordance with the pulse signal;
    comparison means for comparing an output of said light reception means with a reference value relevant to at least one of a recording mode, erasing mode and reproducing mode thereby to produce a signal for setting the light output of said laser diode depending on an operation mode;
    sampling-holding means for sampling and holding an output of said comparison means;
    selection means for selecting an output of said sampling-holding means depending on the operation mode and delivering the output of said sampling-holding means to said driving means;
    decay determination means for determining the deterioration of the light emitting performance of said laser diode and determining whether to replace said laser diode based on the detection of a variation of a level of the light output of said laser diode, with the light output thereof being set to a value relevant to at least one of the recording mode and erasing mode; and
    means for controlling said sampling-holding means and said selection means depending on the operation mode.

7. The laser diode decay determination device according to claim 6, wherein said decay determining means comprises:

first means for detecting, as a first light output level at a first time point, the light output produced by said laser diode in accordance with the pulse signal;

second means for detecting the light output as a second light output level at a second time point which is later than the first time point; and means for determining the light emitting performance of said laser diode to be deteriorated and determining to replace said laser diode upon detecting that a difference between the first light output level and the second light output level is greater than a predetermined value.

8. The laser diode decay determination device according to claim 7, wherein the reference value provided for said comparison means in correspondence with at least one of the recording mode and erasing mode is modified in accordance with a difference of said first light output level and said second light output level.

9. The laser diode decay determination device according to claim 6 further including means for displaying a result of a decay determination in accordance with an output of said decay determining means.

10. The laser diode decay determination device according to claim 6 further including means for emitting an acoustic alarm to indicate replacing said laser diode in accordance with an output of said decay determining means.

11. A laser diode decay determination device for determining whether to replace a laser diode based on a deterioration of light emitting performance of said laser diode used to perform at least one of record, reproduce and erase information signals on a magneto-optical recording disk having an automatic laser power control (ALPC) area for controlling a light output of the laser diode to follow a predetermined value, said device comprising:

means for setting the light output level of said laser diode to a predetermined value during a time period corresponding to the ALPC area of said disk; and means for determining the deterioration of the light emitting performance of said laser diode and determining whether to replace said laser diode based on the detection of a variation of the light output level of said laser diode at time points immediately after the time period corresponding to the ALPC area.

12. The laser diode decay determination device according to claim 11, wherein said decay determining means comprises:

first means for detecting, as a first light output level at a first time point, the light output produced by said laser diode in accordance with the pulse signal;

second means for detecting the light output as a second light output level at a second time point which is later than the first time point; and means for determining the light emitting performance of said laser diode to be deteriorated and determining to replace said laser diode upon detecting that a difference between the first light output level and the second light output level is greater than a predetermined value.

13. The laser diode decay determination device according to claim 11 further including means for displaying a result of a decay determination in accordance with an output of said decay determining means.

14. The laser diode decay determination device according to claim 11 further including means for emitting an acoustic alarm to indicate replacing said laser diode in accordance with an output of said decay determining means.

15. A laser diode decay determination device for determining whether to replace a laser diode based upon a deterioration of light emitting performance of said laser diode used to perform at least one of record, reproduce and erase information signals on a magneto-optical recording disk having an automatic laser power control (ALPC) area for controlling a light output of a laser diode to follow a predetermined value, said device comprising:

means for driving said laser diode during a time period of corresponding to the ALPC area of said magneto-optical recording disk in accordance with a pulse signal;

light reception means for receiving the light output of said laser diode produced in accordance with the pulse signal;

means for comparing an output of said light reception means with a reference value relevant to at least one of the recording mode and the reproducing mode thereby to produce a comparison output signal for setting the light output of said laser diode depending on the mode;

means for shifting a level of the comparison output signal;

sampling-holding means for sampling and holding the comparison output of said comparison means in accordance with a control signal;

selection means for selecting an output of said sampling-holding means depending on the mode and delivering the output of said sampling-holding means to said driving means;

decay determination means for determining the deterioration of the light emitting performance of said laser diode and determining whether to replace said laser diode based on detection of a variation of the light output of said laser diode at time points immediately after the time period corresponding to the ALPC area, with the light output of said laser diode being set to a value relevant to at least one of the recording mode and the erasing mode; and means for controlling said sampling-holding means and said selection means depending on the mode.

16. The laser diode decay determination device according to claim 15, wherein said decay determining means comprises:

first means for detecting, at a first time point as a first light output level, the light output produced by said laser diode in accordance with the pulse signal;

second means for detecting the light output as a second light output level at a second time point which is later than the first time point; and means for determining the light emitting performance of said laser diode to be deteriorated and determining to replace said laser diode upon detecting that a difference between the first light output level and the second light output level is greater than a predetermined value.

17. The laser diode decay determination device according to claim 15 further including means for displaying a result of decay determination in accordance with an output of said decay determining means.

18. The laser diode decay determination device according to claim 15 further including means for emitting an acoustic alarm to indicate replacing said laser diode in accordance with an output of said decay determining means.

* * * * *